United States Patent [19]
Kubota et al.

[11] Patent Number: 5,834,831
[45] Date of Patent: Nov. 10, 1998

[54] SEMICONDUCTOR DEVICE WITH IMPROVED HEAT DISSIPATION EFFICIENCY

[75] Inventors: Akihiro Kubota; Yuichi Asano; Koichi Sibasaki; Kazuhiro Yonetake, all of Miyagi, Japan; Tsuyoshi Aoki, Selangor Darul Ehsan, Malaysia; Akira Takashima, Kawasaki, Japan

[73] Assignee: Fujitsu Limited, Kawasaki, Japan

[21] Appl. No.: 609,840

[22] Filed: Mar. 1, 1996

Related U.S. Application Data

[63] Continuation-in-part of Ser. No. 490,006, Jun. 13, 1995, abandoned.

[30] Foreign Application Priority Data

| Aug. 16, 1994 | [JP] | Japan | 6-192538 |
| Dec. 7, 1994 | [JP] | Japan | 6-303958 |
| Aug. 14, 1995 | [JP] | Japan | 7-207218 |

[51] Int. Cl.⁶ ............................. H01L 23/50
[52] U.S. Cl. ............ 257/674; 257/666; 257/676; 257/690; 257/692; 257/698; 257/775
[58] Field of Search ................ 257/674, 692, 257/775, 666, 690, 673, 698, 773, 735, 737, 675, 796, 676, 670

[56] References Cited

U.S. PATENT DOCUMENTS

| 3,778,685 | 12/1973 | Kennedy | 257/735 |
|---|---|---|---|
| 4,994,411 | 2/1991 | Naito et al. | 437/209 |
| 5,357,139 | 10/1994 | Yaguchi et al. | 257/666 |
| 5,442,231 | 8/1995 | Miyamoto et al. | 257/666 |
| 5,559,366 | 9/1996 | Fogul et al. | 257/676 |
| 5,583,372 | 12/1996 | King et al. | 252/676 |
| 5,616,953 | 4/1997 | King et al. | 257/666 |
| 5,648,682 | 7/1997 | Nakazawa et al. | 257/676 |

FOREIGN PATENT DOCUMENTS

| 59-98547 | 4/1984 | Japan . | |
|---|---|---|---|
| 0174658 | 8/1986 | Japan | 257/692 |
| 0239852 | 10/1988 | Japan | 257/673 |
| 1-293553 | 11/1989 | Japan . | |
| 2-122660 | 5/1990 | Japan | 257/670 |
| 4-120765 | 4/1992 | Japan | 257/775 |
| 0029335 | 2/1994 | Japan | 257/666 |
| 6-132441 | 5/1994 | Japan . | |
| 0188333 | 7/1994 | Japan | 257/690 |
| 6-196614 | 7/1994 | Japan . | |
| 2187331 | 9/1987 | United Kingdom | 257/673 |

*Primary Examiner*—Tom Thomas
*Assistant Examiner*—Alexander Oscar Williams
*Attorney, Agent, or Firm*—Armstrong, Westerman, Hattori, McLeland & Naughton

[57] ABSTRACT

A thin semiconductor device in which a strength of a lead frame and a heat dissipation efficiency can be improved. The semiconductor device has a semiconductor chip, a lead having an inner lead and an a outer lead continuing to the inner lead, said inner lead having a thin plate portion thinner than the other portion therof, said thin plate portion being electrically connected to said semiconductor chip through a wire and said outer lead serving as an outer connecting terminal, and a sealing resin sealing said semiconductor chip and at least a part of said lead, wherin said inner lead of said lead is positioned on said semiconductor chip.

12 Claims, 16 Drawing Sheets

SEMICONDUCTOR DEVICE WITH IMPROVED HEAT DISSIPATION EFFICIENCY

CROSS-REFERENCE TO THE RELATED APPLICATION

The present invention is a continuation-in-part (CIP) of application, Ser. No. 08/490,006 filed on Jun. 13, 1995, now abandoned.

BACKGROUND OF THE INVENTION

1. Field of the Invention

The present invention generally relates to a semiconductor device, and more particularly to a semiconductor device in which a strength of a lead frame and a heat dissipation efficiency can be improved, and the thickness thereof is reduced.

2. Description of the Related Art

Currently, in order to respond to a demand for a high-performance semiconductor device, a number of pins provided in a QFP (Quad Flat Package) type semiconductor has been increased. With this trend, an inner lead in a lead frame used in the semiconductor device becomes thinner and the strength thereof is lowered. Also, a heat amount generated by a semiconductor chip is increased. Therefore, the strength of the lead frame and the heat dissipation efficiency of the semiconductor chip are required to be improved.

FIGS. 1A, 1B and 1C are sectional views showing conventional multi-pin type semiconductor devices.

In general, as a semiconductor device including a semiconductor chip is reduced in size to meet the demand for the high-performance semiconductor device, the number of pins is increased and the pitch of the pads formed in the semiconductor chip is decreased. Accordingly, ends of inner leads to be bonded to the pads via wires become fine, and a small-size pitch is required thereof.

However, when a lead frame of, for example, 0.15 mm in thickness is produced, an etching for making the ends of the inner leads with a small pitch is limited in accuracy, and the ends of the inner leads cannot be positioned close to a position at which the semiconductor chip is mounted.

In a semiconductor device 11 shown in FIG. 1A, after a thickness of an end portion 13a of an inner lead 13 of a lead frame 12 is made half of the original by a half that-etching process, the end portion is patterned to the small-size pitch by an etching process.

The semiconductor device 11 is disclosed in Japanese Laid-Open Patent Application No. 59-98547. In the semiconductor device 11, a film 15 is attached to the above-mentioned inner lead (end portion 13a). Between the inner leads 13 facing each other on the film 15, a semiconductor chip 16 is mounted through an adhesive 17. After the end portions 13a of the inner leads 13 are bonded to pads provided in the semiconductor chip 16 through wires 18, a package 19 is formed by a resin molding. Outer leads 14 extending from the package 19 are formed in a gull-wing shape for a surface connection.

On the other hand, a semiconductor device 21 shown in FIG. 1B is disclosed in Japanese Laid-Open Patent Application No. 4-6863. In this semiconductor device 21, an end portion 23a of an inner lead 23 in a lead frame 22 is apart from a semiconductor chip 25 in order that a plurality of pins can be provided in the semiconductor device 21. In this case, a heat spreader 26 on which the end portions 23a of the inner leads 23 are secured is used in order to improve a heat dissipation efficiency. On the heat spreader 26, the semiconductor chip 25 is mounted through an adhesive 27. Pads provided on the semiconductor chip 25 are connected to the end portions 23a of the inner leads 23 through wires 28. A package 29 is formed by a resin molding and outer leads 24 extending from the package 29 are formed in the gull-wing shape.

In a semiconductor device 21A shown in FIG. 1C, on the heat spreader 26 shown in FIG. 1B, patterns 26a connected to corresponding inner leads 23 are formed. The pads in the semiconductor chip 25 are bonded to the patterns 26a through wires 28a. These wires 28a can be shorter than the wires 28 and a cost for wires can be reduced accordingly.

However, in the semiconductor device 11 shown in FIG. 1A, though the thin end portions 13a of the inner leads 13 are reinforced by the film 15, the end portions 13a are not strong enough. That is, the end portions 13a may be changed in shape when the molding resin is molded at a high pressure, and a reliability of the semiconductor device 11 may be lowered.

Also, in the semiconductor device 21 shown in FIG. 1B, though a multi-pin type semiconductor device is available without making the inner leads 23 thinner, the end portions 23a cannot be positioned close to the semiconductor chip 25 and the wires 28 become longer. It increases the cost for wires and prevents a high-speed operation of the semiconductor device.

Further, in the semiconductor device 21A shown in FIG. 1C, though the wires 28a are shorter, the cost is increased by forming the patterns 26a on the heat spreader 26.

Moreover, in the semiconductor devices 11, 21, 21A shown in FIGS. 1A, 1B, 1C, the inner lead 13, 23 of the lead frame 12 is located under the semiconductor chip 16, 25. The wire loop is required to be higher so that the wire 18, 28, 28a does not contact the corner portion of the semiconductor chip 16, 25. Accordingly, in the semiconductor devices 11, 21, 21A, the loop height of the wire 18, 28, 28a is higher and it is difficult to reduce the thickness thereof.

SUMMARY OF THE INVENTION

Accordingly, it is a general object of the present invention to provide a novel, useful semiconductor device in which a strength of a lead frame and a heat release efficiency can be improved, and the thickness thereof is reduced.

The above object of the present invention is achieved by a semiconductor device comprising a semiconductor chip, a lead having an inner lead and an outer lead continuing to the inner lead, the inner lead having a thin plate portion thinner than the other portion thereof, the thin plate portion being electrically connected to the semiconductor chip through a wire and the outer lead serving as an outer connecting terminal, a sealing resin sealing the semiconductor chip and at least a part of the lead, wherein the inner lead of the lead is positioned on the semiconductor chip. According to the invention, by a lead-on-chip (LOC) structure in which the inner lead is on the upper face of the semiconductor chip, an edge-short-circuit, which is a contact of the wire to a corner of the semiconductor chip 36, can be avoided. Also, by the thin plate portion connected to the semiconductor chip through the wire, the wire can be connected to the inner lead at a lower level, which level is closer to the semiconductor chip. Thus, the height of the wire loop can be reduced and the thickness of the semiconductor device can be reduced.

In the above invention, the wire may have a looped shape whose height is lower than that of the lead except where the thin plate portion is formed. According to the invention, the thickness of the semiconductor device can further be reduced.

In the above invention, the lead except where the thin plate portion is formed may be exposed from the sealing resin. According to the invention, the heat dissipation efficiency can be improved. That is, in the semiconductor device of the LOC structure, the lead is adjacent to or contacting the semiconductor chip and a heat generated in the semiconductor chip is conducted to the lead. Therefore, by the lead exposed from the sealing resin, the heat can be dissipated efficiently and the heat dissipation efficiency of the semiconductor chip can be improved.

In the above invention, the thin plate portion may be reduced in thickness intermittently toward the tip end thereof. Also, in the above invention, the thin plate portion may have a tapered shape which is reduced in thickness gradually toward the tip end thereof. According to the invention, the thin plate portion can be produced easily.

Other objects and further features of the present invention will be apparent from the following detailed description when read in conjunction with the accompanying drawings.

DESCRIPTION OF THE PREFERRED EMBODIMENTS

Figure 1A:
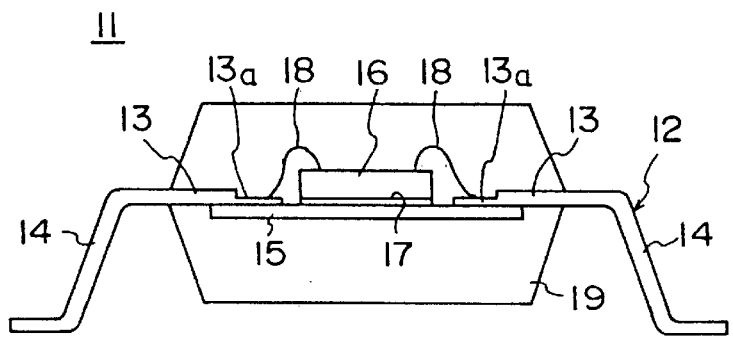
FIGS. 1A, 1B and 1C are sectional views showing conventional semiconductor devices of a multipin type.
Figure 1B:
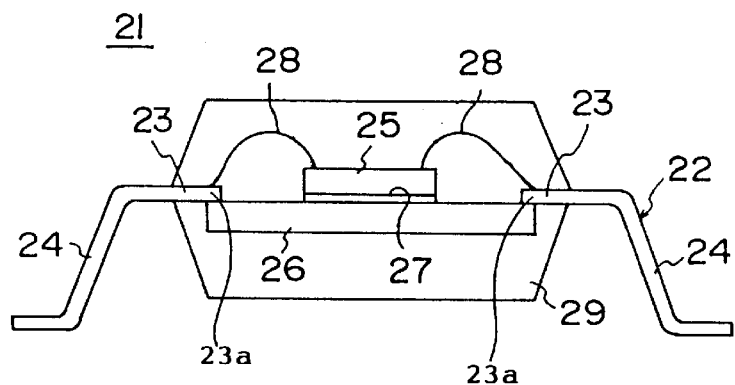
Figure 1C:
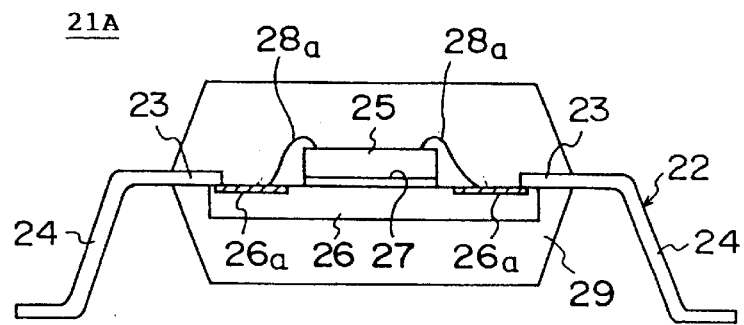

Referring to the drawings, the preferred embodiments of the present invention will now be described in further detail.

Figure 2A:
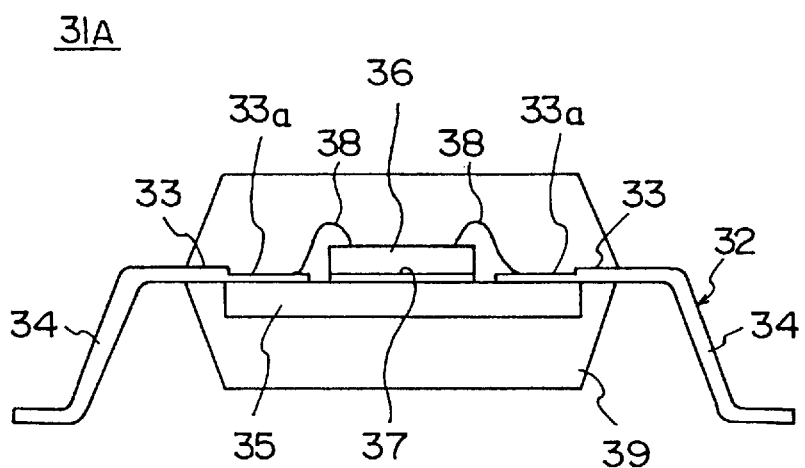
FIG. 2A is a vertical sectional view showing a first embodiment of the present invention.
Figure 2B:
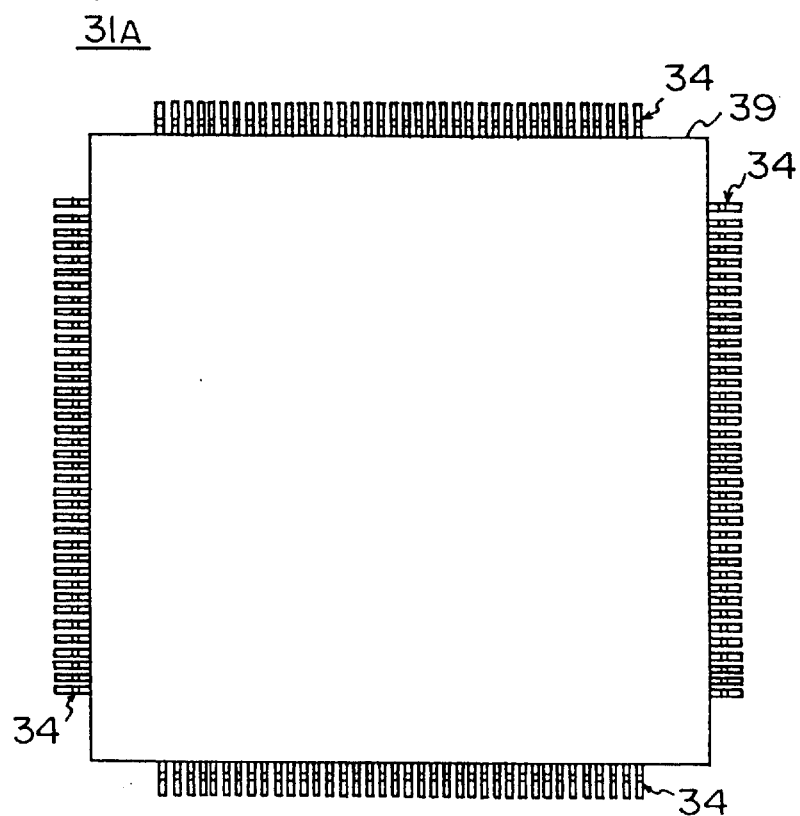
FIG. 2B is a plan view showing the first embodiment of the present invention.

FIG. 2A is a vertical sectional view showing a first embodiment of the present invention and FIG. 2B is a plan view thereof.

A semiconductor device 31A shown in FIGS. 2A and 2B is a QFP-type semiconductor device having a lead frame 32. The lead frame 32 has a plurality of inner leads 33 and outer leads 34. An inner end of the inner lead 33 is a thin plate portion 33a, which is thinner than other portions of the lead frame 32 (described in detail in FIGS. 3A, 3B and 3C). The thin plate portion 33a of the inner lead 33 is secured on a heat spreader 35 (described in detail in FIG. 4), which functions as a heat dissipation member, through an adhesive. On the central portion of the heat spreader surrounded by the inner leads 33 (thin plate portions 33a), a small-size semiconductor chip 36 is mounted through an adhesive 37, for example, a silver paste. In this case, the thin plate portions 33a of the inner leads 31 are arranged close around the semiconductor chip 36.

The thin plate portions 33a of the inner leads 33 are bonded and electrically connected to electrode pads (not shown in the drawings) formed on the semiconductor chip 36 through wires 38 made of, for example, gold. A package 39 or a sealing portion is formed by a sealing resin in which the heat spreader 35 is buried. The outer leads 34 of the lead frame 32 extending from four sides of the package 39 and are formed in a gull-wing shape for surface connections.

Figure 3A:
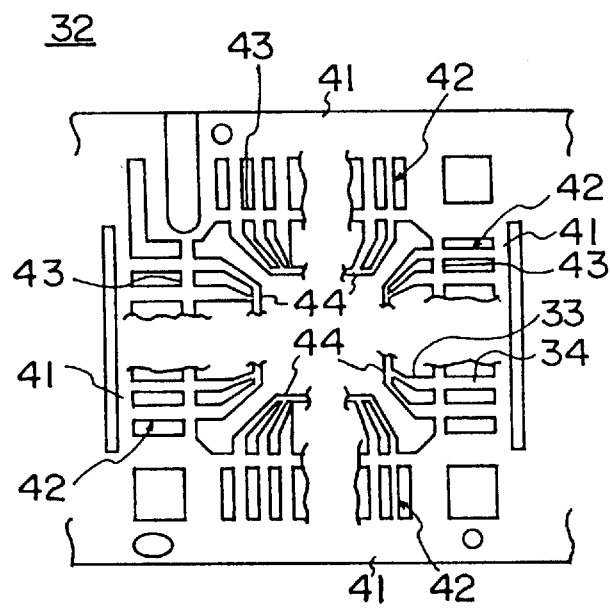
FIG. 3A is a plan view showing an lead frames provided in series for one semiconductor device.
Figure 3B:
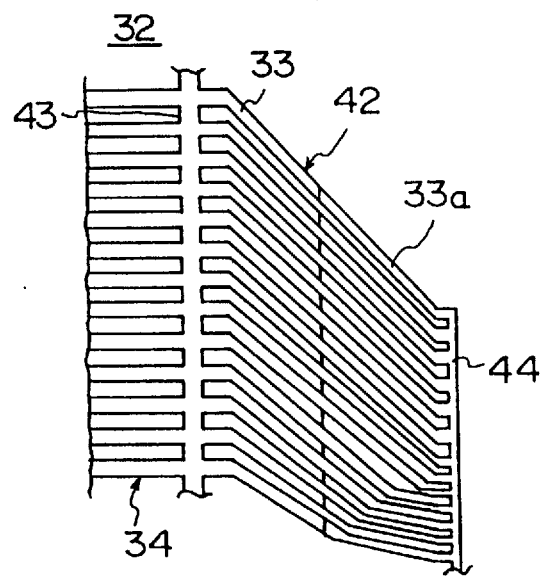
FIG. 3B is a fragmentary plan view showing an inner lead.
Figure 3C:
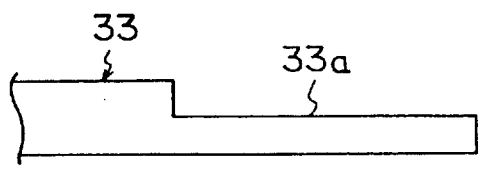
FIG. 3C is a sectional view showing an inner lead.

FIG. 3A is a plan view showing the lead frame provided in series for one semiconductor device. FIG. 3B is a fragmentary plan view of the inner leads. FIG. 3C is a sectional view showing an inner lead.

In the lead frame 32 shown in FIG. 3A, lead terminals 42 are provided between cradles and are connected to each other through a tiebar 43. A central side of the tiebar 43 is the inner leads 33 and the outer side of the tiebar 43 is the outer leads 34. A central end of each inner lead is connected to a connecting portion 44. In the space surrounded by the connecting portions 44, the semiconductor chip 36 is mounted. These are formed by, for example, an etching process on a 0.15 mm thick metal plate of, for example, copper alloy.

FIG. 3B is a fragmentary enlarged view of lead terminal 42. The tiebar 43 and the connecting portion 44 are removed by cutting in a prescribed process. At the end of the inner lead 33, as shown in FIG. 3A, 3B and 3C, a thin plate portion 33a of a prescribed length is formed. The thin plate portion 33a is formed to, for example, about 0.075 mm in thickness by a half-etching process, as shown in FIG. 3C.

In this type of lead frame 32, the thin plate portion 33a is formed at the end of the inner lead 33. Accordingly, even when the thin plate portion 33a is positioned close to the area in which the semiconductor chip 36 is provided, the inner lead 33 can be formed to microscopic pitch by an etching process.

Accordingly, since the wire 38 to make an electrical connection to the semiconductor chip 35 can be decreased in length in a multi-pin type semiconductor device, a cost for wire can be decreased. Also, a high-speed operation due to a reduction of impedance and a reliability of the device due to a reduction of wire flow can be improved. By the inner leads 33 being arranged close to the semiconductor chip 36, the present invention can cope with different size of the semiconductor chips 36. Therefore, the yield of the semiconductor device can be improved.

Since the connecting portion 44 is incorporated with the thin plate portions 33a of the inner leads 33 before the thin plate portions 33a are secured, a strength of the lead frame 32 can be improved and a change in shape thereof can be prevented when it is conveyed. Therefore, a yield of the semiconductor device 32 can be improved.

After the connecting portion 44 in the inner lead 33 is cut and removed, most of the thin plate portion 33a is secured on the heat spreader 35. Accordingly, the thin plate portion 33a is not changed in shape after the resin is molded. Therefore, the yield of the semiconductor device can be improved.

The semiconductor chip 36 is mounted on the central portion of the heat spreader 35. The connecting portions 44 of the inner lead frame 32 are arrange around the semiconductor chip 36, as described later.

The heat spreader 35 can be made of, for example, copper-tungsten (W-C) alloy. A thermal expansion coefficient of 20% W-Cu alloy is $5.1 \times 10^{-6}/°C$. at 400° C. and $7.3–7.7 \times 10^{-6}/°C$. at 800° C. A thermal conductivity thereof is 0.58 cal/cm·sec·°C. A thermal expansion coefficient of 30% W-Cu alloy is $10.6 \times 10^{-6}/°C$. at 400° C. and $12.0 \times 10^{-6}/°C$. at 800° C. A thermal conductivity thereof is 0.67 cal/cm·sec·°C. That is, the thermal conductivity of the W—Cu alloy used in the heat spreader 35 is in the same rank as one of a copper alloy (0.25–0.85 cal/cm·sec·° C.) and a heat release characteristic thereof is excellent.

Figure 4:
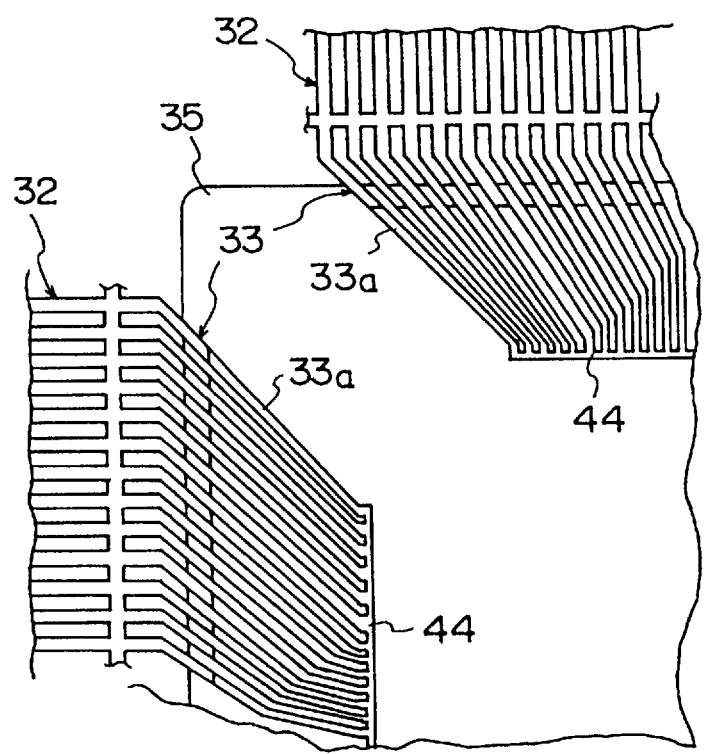
FIG. 4 is a fragmentary plan view showing 1inner leads mounted on a heat spreader.
Figure 5:
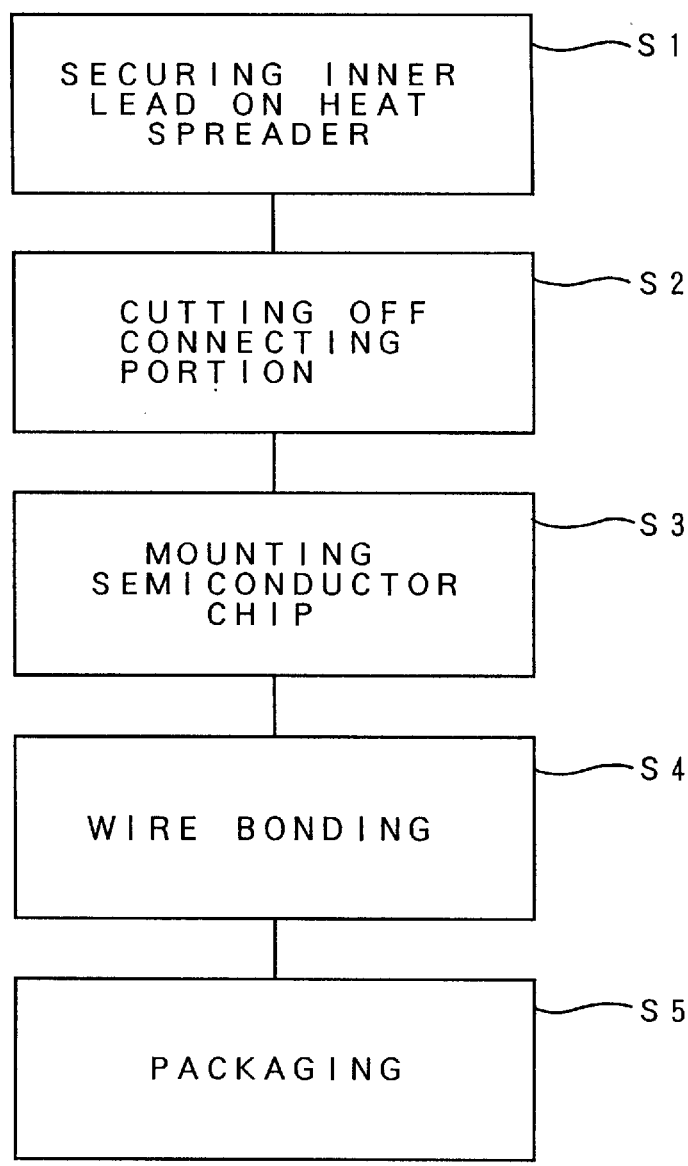
FIG. 5 is a flowchart describing a method for producing a semiconductor device of the present invention.

FIG. 4 is a fragmentary plan view of inner leads 33 mounted on the heat spreader 35. FIG. 5 is a flowchart for describing a method for producing the semiconductor device 31A.

Figure 6:
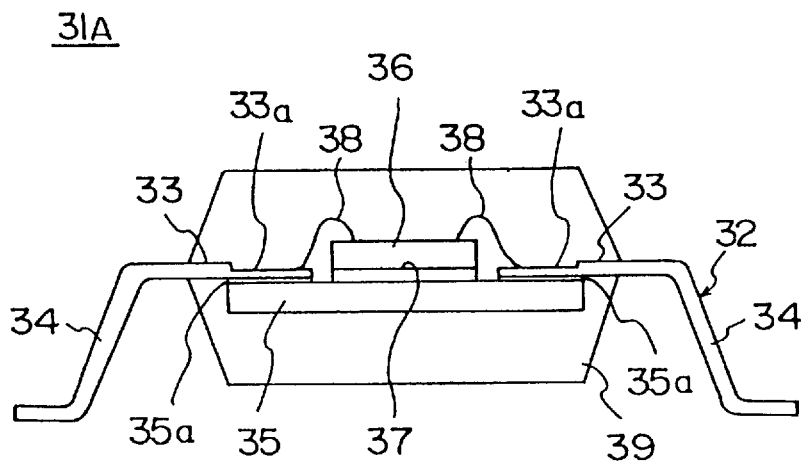
FIG. 6 is a vertical sectional view showing a variation of the first embodiment of the present invention.

Referring to FIG. 5, the inner leads 33 of the lead frame 32 are secured on the heat spreader 35 through an adhesive 35a shown in FIG. 6 (Step S1). At this moment, as shown in FIG. 5, the connecting portions 44 or the ends of the thin plate portions 33a are arranged around the heat spreader 35. By making a contact area between the inner lead 33 and heat spreader 35 a maximum, heat dissipation characteristics and electric characteristics can be improved. Also, an adhesive quality can be improved to adjust an error caused by a thermal shrinkage after the package is formed.

On the heat spreader 35, the connecting portion 44 of the inner leads 33 are cut and removed by, for example, exposing a laser rays thereon (Step S2). Next, the semiconductor chip 36 is mounted on the central portion of the heat spreader 35 through the adhesive 37 (Step S3). After that, the electrode pads (not shown in the drawings) are bonded to the thin plate portions 33a (a portion on the heat spreader 35) of the inner leads 32 through the wires 38 (Step S4). After that, the semiconductor device is placed in a mold and molding resin (i.e epoxy resin) is molded to form the package 39 (Step S5).

In this manner, the inner ends of the thin plate portions 33a are incorporated with the connecting portion 44 before the inner leads 33 are secured on the heat spreader 35. Accordingly, the strength of the thin plate portion is improved and the change in shape of the leads can be prevented when it is conveyed. Also since the thin plate portion 33a is secured on the heat spreader 35 when the mold resin is molded, the change in shape of the lead frame 32 due to pressure can be prevented.

FIGS. 6–9 are vertical sectional views showing variations of the first embodiment. In a semiconductor device 31A shown in FIG. 6, a wider area of the inner end of the inner lead 33 including the thin plate portion 33a of the lead frame 32 is secured on the heat spreader 35 through an adhesive member 35a such as a PI (polyimide) tape and an epoxy adhesive in the semiconductor device 31A shown in FIGS. 2A and 2B. The other features thereof are the same as the ones shown in FIGS. 2A and 2B. That is, as the inner ends of the inner leads 33 are secured on the heat spreader 35 over a larger contacting area, an error due to heat shrinkage can be adjusted and the wire 38 is prevented from being cut when the package 39 is molded. Accordingly, the yield of the semiconductor device can be improved.

Figure 7:
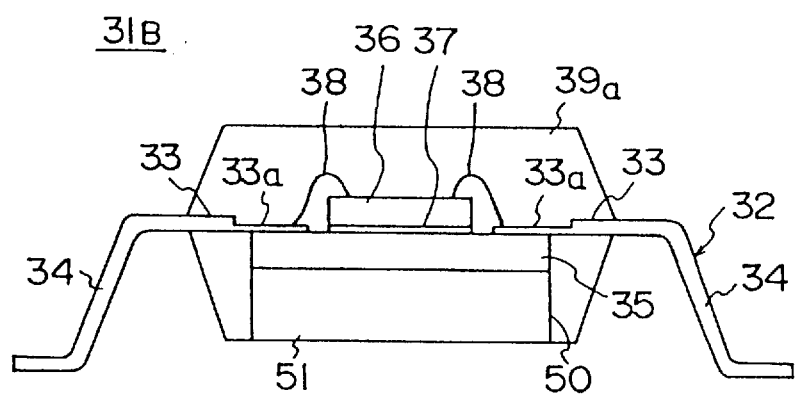
FIG. 7 is a vertical sectional view showing another variation of the first embodiment of the present invention.

In a semiconductor device 31B shown in FIG. 7, an opening portion 50 is formed at the bottom of the package 39 of the semiconductor device 31A shown in FIGS. 2A and 2B when a package 39a is formed. Through the opening portion 50, an opposite surface of the heat spreader 35 to the surface on which the semiconductor chip 36 is exposed. In the opening portion 50, a heat dissipation plate 51 which contacts the heat spreader 35 is buried. At least one surface of the heat dissipation plate 51 is exposed.

In order to form the opening portion 50, a protruding portion for forming the opening portion 50 is formed in a mold. The opening portion 50 can be formed by the protruding portion of the mold contacting the heat spreader 35 when the molding is conducted.

According to the semiconductor device 31B, a heat dissipation efficiency of a heat at an increased temperature, resulting from the semiconductor chip 36 being decreased in size, can be much improved by the heat spreader 35 and heat dissipation plate 51.

Figure 8A:
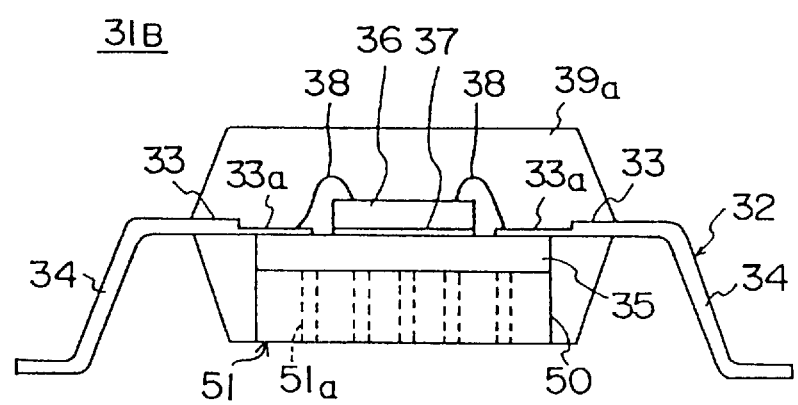
FIG. 8A is a vertical sectional view showing another variation of the first embodiment of the present invention.
Figure 8B:
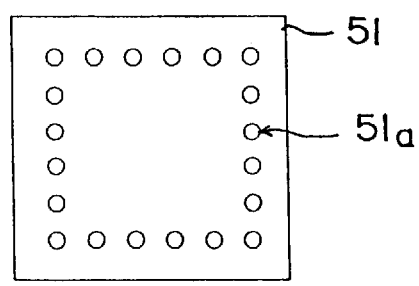
FIG. 8B is a bottom view showing a heat release board.

In the semiconductor device 31B shown in FIG. 8A, a prescribed number of penetration holes 51a are formed in the heat dissipation board 51 from the heat spreader 35 side to the exposing surface. In this case, as shown in FIG. 8B, penetration holes 51a are formed to be arranged at the periphery of the exposing surface. That is, the penetration holes are formed in an area at a distance away from the semiconductor chip 36 mounting surface.

According to the semiconductor device 31B shown in FIGS. 8A and 8B, water included in the mold resin is drained from the boundary of the heat spreader 35 and heat dissipation member 51 through the penetration holes 51a when the resin is hardened. In this case, drain holes are formed in a mold at a position corresponding to the penetration holes 51a of the heat release board.

Accordingly, cracking of the package 39a is prevented and the package efficiency is improved. That is, in order to prevent the cracking of the package 39a, a mold resin of a higher strength is not required. By providing penetration holes 51a in the heat dissipation board 51, a mold resin of normal strength can be used and the increase in cost can be prevented.

Figure 9:
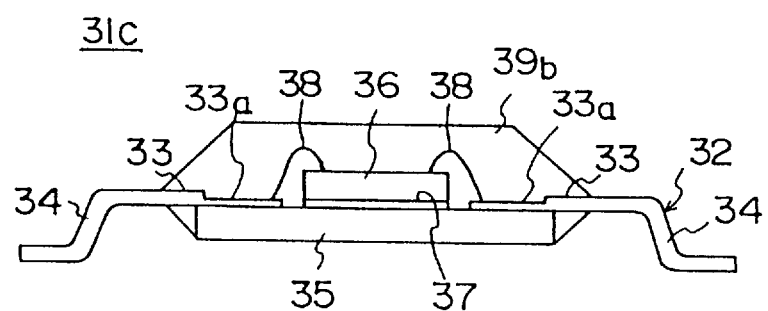
FIG. 9 is a vertical sectional view showing another variation of the first embodiment of the present invention.

In a semiconductor device 31C shown in FIG. 9, when a package 39b is formed, the opposite surface of the heat spreader to the surface on which the semiconductor chip 36 is mounted is exposed. This can be formed, for example, by the resin being molded after a bottom of a cavity of an under mold is attached to the heat spreader 35.

According to the semiconductor device 31C, since the bottom surface of the heat spreader 35 is exposed, a heat dissipation efficiency can be improved and the device can be made thinner.

FIGS. 6–9 show different variations respectively, however these variations can be combined properly (i.e. FIG. 6 and FIG. 7, FIG. 6 and FIG. 8A, or FIG. 6 and FIG. 9). Needless to say, variations in the embodiments described later can also be combined properly.

FIG. 10A, 10B and FIG. 11A, 11B, 11C show variations of the thin plate portion of the first embodiment of the present invention.

Figure 10A:
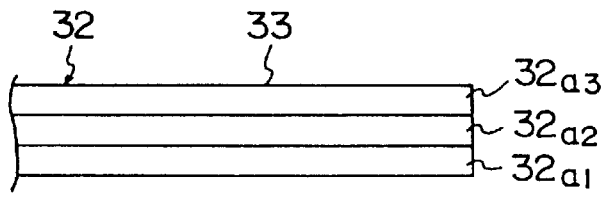
FIGS. 10A and 10B are schematic illustrations showing fabrication steps for a variation of the thin plate portion in the first embodiment of the present invention.
Figure 10B:
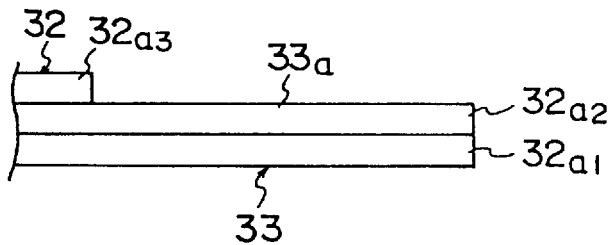

FIG. 10A shows an inner end of the inner lead in which thin metal members $32a_1$–$32a_3$ are laminated to form the lead frame 32 including the lead terminal 42 shown in FIGS. 3A, 3B and 3C. For example, the metal plate members $33a_1$, $33a_3$ can be made of iron material and the metal plate member $33a_2$ can be made of copper material. As shown in FIG. 10B, the inner end of the inner lead 33 can be half-etched selectively in order to form the thin plate portion 33a.

Figure 11A:
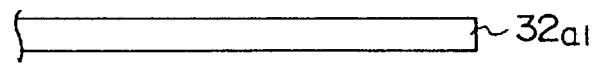
FIGS. 11A, 11B and 11C are schematic illustrations showing fabrication steps for another variation of the thin plate portion in the first embodiment of the present invention.
Figure 11B:
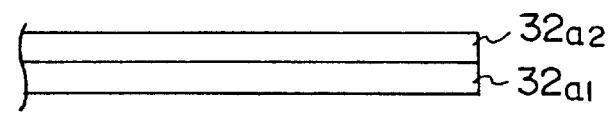
Figure 11C:
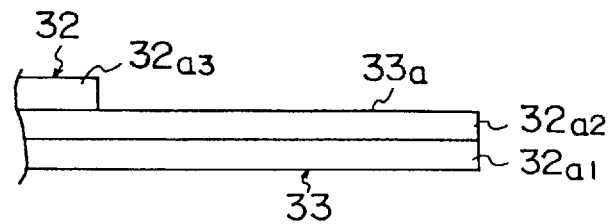

FIG. 11A, 11B and 11C show a lead frame 32 including the lead terminal 42 shown in FIGS. 3A, 3B and 3C in which thin metal plate members $32a_1$–$32a_3$ are laminated. At the inner end portion of the inner lead 32, the metal plate member $32a_2$ shown in FIG. 11B is laminated on the metal plate member $32a_1$ shown in FIG. 11A. On the metal plate member $32a_2$, the metal plate member $32a_3$ in which an end to be a thin plate portion 33a is cut off in advance is laminated as shown in FIG. 11C. According to the lead frame shown in FIG. 11C, the thin plate portion 33a can be made without an etching process compared to the lead frame shown in FIGS. 10A and 10B. In this case, the metal plate member $32a_1$–$32a_3$ can be made of iron material and copper material as described in FIG. 10A and 10B, or all of them can be made of the same copper material. Therefore, if the lead frame 32 (lead terminal 42) is made of thin metal members $32a_1$–$32a_3$, the thin plate portion 33a can be made easily.

Figure 12A:
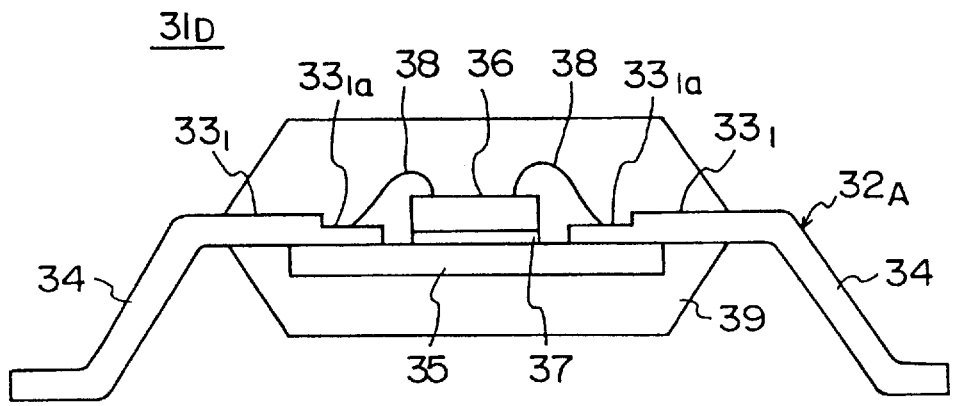
FIG. 12A is a vertical sectional view showing a semiconductor device of the second embodiment of the present invention.
Figure 12B:
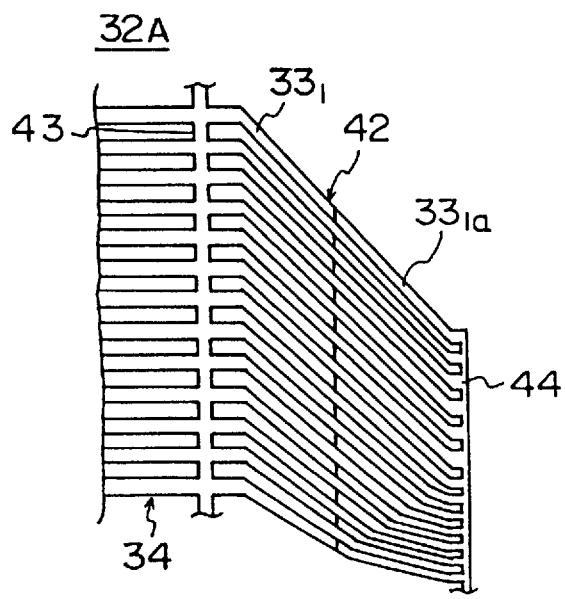
FIG. 12B is a fragmentary plan view showing an inner end portion of the inner lead of the second embodiment of the present invention.
Figure 12C:
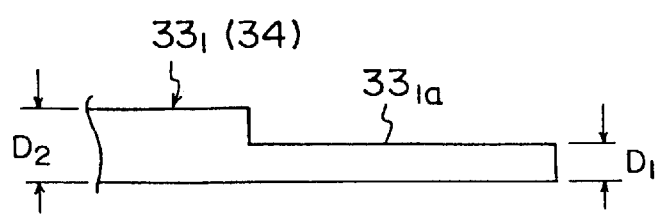
FIG. 12C is a sectional view showing the inner lead.

FIG. 12A is a vertical sectional view of a semiconductor device 31D of a second embodiment of the present invention. FIG. 12B is a fragmentary plan view showing a lead terminal (inner lead $33_1$, outer lead 34) in a lead frame 32A. FIG. 12C is a sectional view showing an inner end portion of the inner lead $33_1$.

As shown in FIG. 12A, a semiconductor chip 36 is mounted on a heat spreader 35 through an adhesive. The inner leads $33_1$ of the lead frame 32A is secured around the semiconductor chip 36 through an adhesive. In the lead frame 32A, the inner ends of the inner leads $33_1$ are originally connected through a connecting portion 44. After the lead frame 32A is secured on the heat spreader 35, the connecting portion 44 is cut off and the inner leads $33_1$ are separated respectively. If the leads of the semiconductor device 31D are fine-pitched, a thin plate portion $33_1a$ is required to be thinner than the conventional lead frame, as shown in the first embodiment. If the thin plate portion $33_1a$ is not required to be thinner, the thickness $D_1$ of the thin plate portion $33_1a$ is set to the conventional thickness, 0.125–0.15 mm and the thickness $D_2$ of the other portion (a part of the inner lead $33_1$ and outer lead 34) is set to a greater thickness (i.e. 0.2–0.25 mm), as shown in FIGS. 12A, 12B and 12C.

That is, by setting the thickness $D_2$ of the outer lead 34 to the greater thickness, the thermal resistance is reduced and the heat release efficiency can be improved. Also, the mechanical strength of the outer lead 34 is increased and the change in shape of the outer lead 34 can be prevented when it is conveyed. Therefore, package efficiency and transportation characteristics can be improved.

Referring back to the FIG. 12A, the semiconductor chip 36 (electrode pad) is electrically connected to the thin plate portion $33_{1a}$ of the inner lead $33_1$ through the wire 38. Also, a package 39 is formed by epoxy resin 50. The outer lead 34 extending from the package 39 is formed in a gull-wing shape.

Hereinafter, a third embodiment of the present invention will be described referring to FIGS. 13–15. In FIGS. 13–15, the same features as those previously described in the above-described embodiments will be denoted by the same reference numerals and the description thereof will be omitted.

Each of semiconductor devices 60A–60D shown in FIGS. 13 and 15 has a lead-on-chip (LOC) structure in which the leads 61 extend to an upper face of the semiconductor chip 36. The lead 61 includes an inner lead 62 and an outer lead 63. The inner lead 62 is connected to the electrode pad 65 provided on the semiconductor chip 36 through a wire 64. The inner lead 62 is formed in a gull-wing shape and functions as an outer connecting terminal.

FIG. 14 is an enlarged view showing the inner lead 62 connected to the wire 64. The inner lead 62 has a thin plate portion 62a to which the wire 64 is connected. The thin plate portion 62a has a staircase-structure as shown in FIG. 14, which can be easily prepared by a conventional press-processing, an etching method or the method previously described. The wire 64 is provided between the thin plate portion 62a and the electrode pad 65 of the semiconductor chip 36 by a conventional method using a wire-bonding device.

Since the semiconductor devices 60A–60D have the LOC structure in which the inner lead 62 of the lead 61 is positioned on the semiconductor chip 36 as described above, the wire 64 is provided on the upper surface of the semiconductor chip 36. Therefore, an edge-short-circuit, which is a contact of the wire 64 to a corner of the semiconductor chip 36, can be assuredly avoided.

Also, since the inner lead 62 has the thin plate portion 62a to which the wire 64 is connected, the wire 64 can be connected to the inner lead 62 at a lower level, which level is closer to the semiconductor chip 36. Thus, a height of the wire loop can be reduced and the semiconductor devices 60A–60D can be made thinner.

In this embodiment, when the height of the wire loop (shown as an arrow h in FIG. 14) is lower than that of the inner lead 62 except the thin plate portion 62a (shown as an arrow H in FIG. 14), the semiconductor devices 60A–60D can be made much thinner.

Hereinafter, each of the semiconductor devices 60A–60D will be described. In the semiconductor device 60A shown in FIG. 13A and the semiconductor device 60B shown in FIG. 13B, the semiconductor chip 36 is mounted on the stage 66. In the semiconductor devices 60A, 60B, a lead frame for forming the leads 61 (lead-side lead frame) is independent from a lead frame for forming the stage 66 (stage-side lead frame). That is, the semiconductor devices 60A, 60B have a multi-frame LOC (MF-LOC) structure in which the leads 61 and the stage 66 are formed by the 2 lead frames.

Figure 13A:
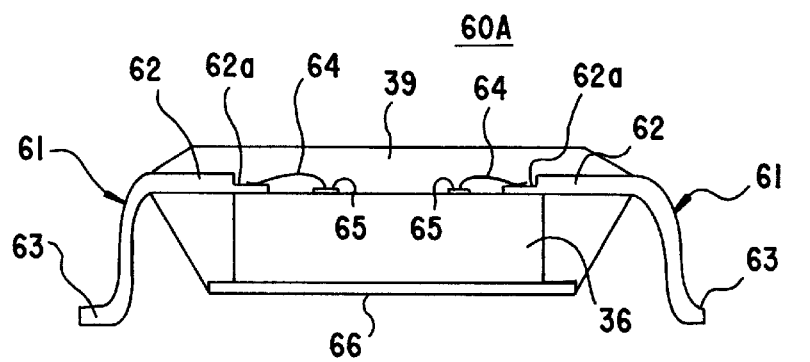
FIGS. 13A and 13B are schematic illustrations showing a third embodiment of the present invention.
Figure 13B:
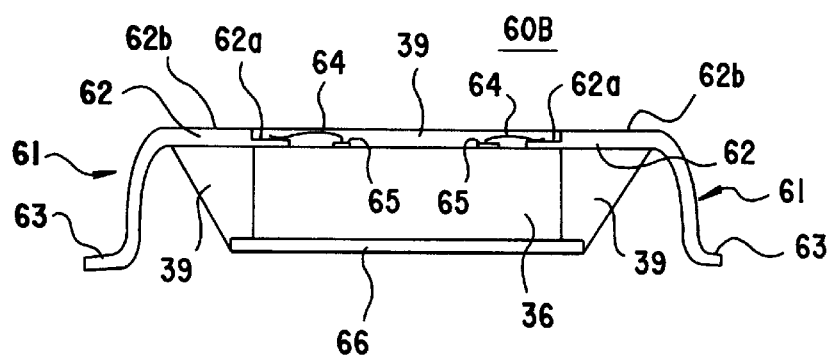
Figure 14:
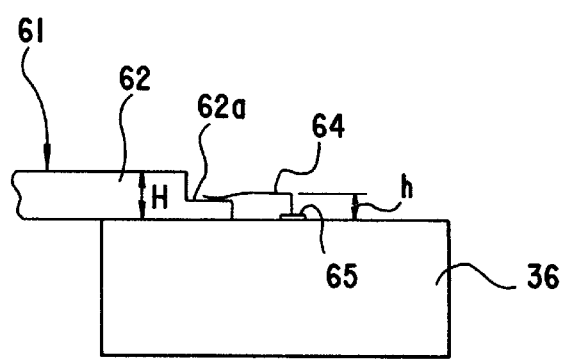
FIG. 14 is an enlarged view showing a thin plate portion shown in FIGS. 13A and 13B.

In the semiconductor device 60A shown in FIG. 13A, the inner leads 62 are completely sealed in the package 39 of sealing resin. In the semiconductor device 60B shown in FIG. 13B, the inner leads 62 have an exposed portion 62b exposed from the package 39. In this semiconductor device 60B also, the thin plate portions 62a are buried in the package 39 and the wires 64 are protected by the package 39.

In the semiconductor device 60B in which the exposed portions 62b of the leads 61 are exposed from the package 39, a heat dissipation efficiency thereof can be improved and the thickness thereof can be reduced.

That is, in the LOC structure, the leads 61 are provided adjacent to or contacting the semiconductor chip 36. Therefore, heat generated in the semiconductor chip 36 is conducted to the leads 61 (the inner leads 62). By the exposed portions 62b of the leads 61, which are exposed from the package 39, a heat generated in the semiconductor chip 36 can be released efficiently and the heat dissipation efficiency of the semiconductor device 60B can be improved. Also, since the package 39 is not provided on the leads 61, except for the thin plate portions 62a, the semiconductor device 60B can be made thinner than the semiconductor device 60A shown in FIG. 13A.

Figure 15A:
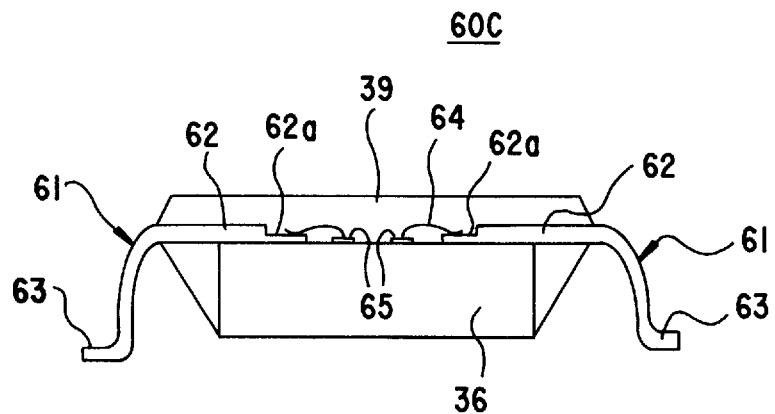
FIGS. 15A and 15B are other schematic illustrations showing the third embodiment of the present invention.
Figure 15B:
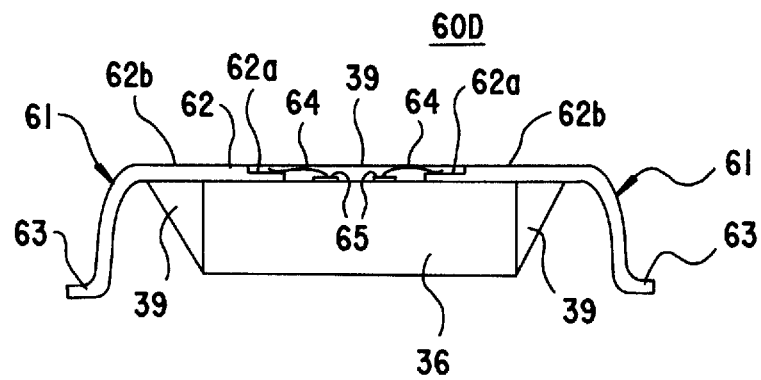

In the semiconductor devices 60C, 60D, the leads 61 are made from only one lead frame and no stage-side lead frame is used, which is different from the semiconductor devices 60A, 60B of the MF-LOC structure. The inner leads 62 are secured to the semiconductor chip 36 through adhesive (not shown). As shown in FIGS. 15A and 15B, even in the semiconductor devices 60C, 60D in which the leads 61 are made by one lead frame, the height of the wire loop can be reduced and the thickness of the semiconductor devices 60A, 60B can be reduced.

In the semiconductor device 60C shown in FIG. 15A, the inner leads 62 are completely sealed in the package 39, just as for the semiconductor device 60A shown in FIG. 13A. In the semiconductor device 60D shown in FIG. 15B, the inner leads 62 have the exposed portions 62b exposed from the package 39 just as in the semiconductor device 60B shown in FIG. 13B. Therefore, a heat dissipation efficiency of the semiconductor chip 36 can be improved and the thickness of the semiconductor device can be reduced.

Figure 16A:
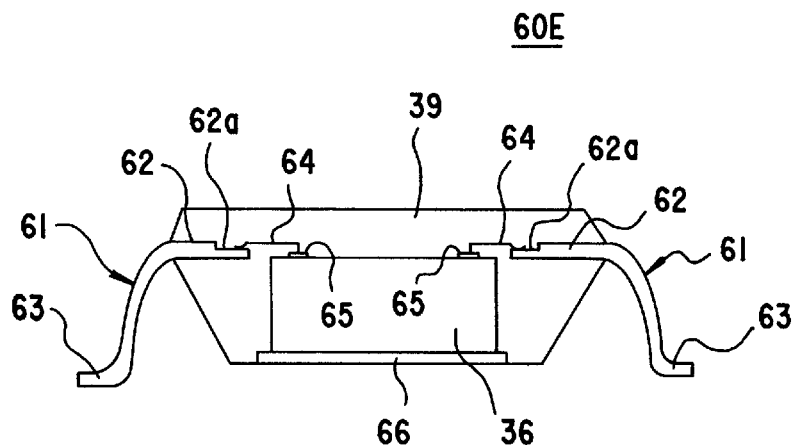
FIGS. 16A and 16B are schematic illustrations showing variations of the third embodiment of the present invention.
Figure 16B:
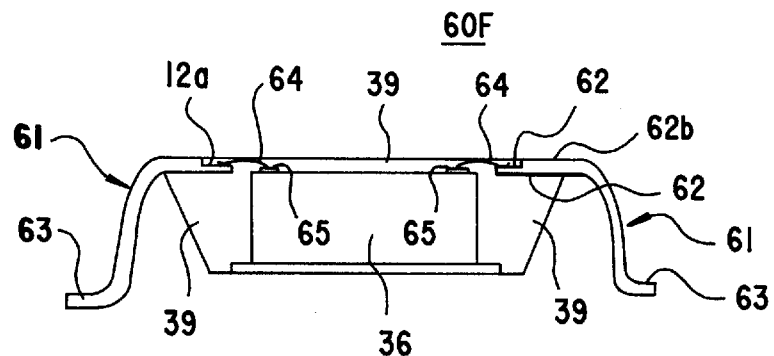
Figure 17:
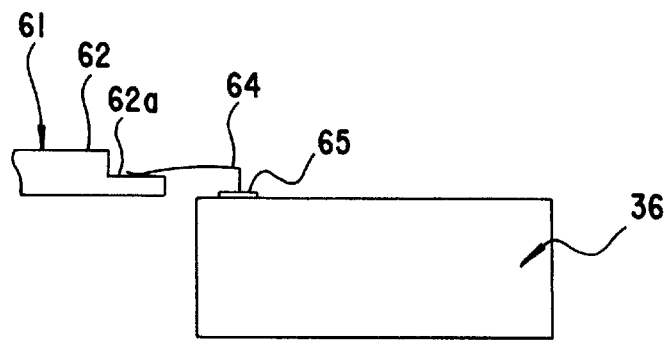
FIG. 17 is an enlarged view showing a thin plate portion shown in FIGS. 16A and 16B.

FIGS. 16A, 16B and 17 show semiconductor devices 60E, 60F, which are variations of the semiconductor devices 60A–60D shown in FIGS. 13–15. In FIGS. 16A, 16B and 17, the same features as those described in FIGS. 13–15 are denoted by the same reference numerals and the description thereof will be omitted.

The above-described semiconductor devices 60A–60D have the LOC structure in which the inner leads 62 extend to the upper surface of the semiconductor chip 36. However, in the semiconductor devices 60E, 60F of this variation, the inner lead 62 extends adjacent to but not contacting the upper surface of the semiconductor chip 36. In this case, the level of the thin plate portion 62a of the inner lead 62 is almost equal to that of the semiconductor chip 36, as shown in FIG. 17.

In the semiconductor devices 60A–60D of non-LOC structure, by providing the leads 61 at the height almost equal to that of the semiconductor chip 36, the height of the wire loop can be made lower preventing the edge-short-circuit and the thickness of the semiconductor devices 60E, 60F can be reduced. In the semiconductor device 60E shown in FIG. 16A, the inner leads 62 are completely sealed in the package 39. In the semiconductor device 60F shown in FIG. 16B, the inner leads 62 have the exposed portion 62b exposed from the package 39 to improve the heat dissipation efficiency of the semiconductor chip 36 and to reduce the thickness of the semiconductor device 60F.

Next, a fourth embodiment of the present invention will be described referring to FIGS. 18–22. In FIGS. 18–22, the same features as those previously described in the above-described embodiments will be denoted by the same reference numerals and the description thereof will be omitted.

In the semiconductor devices 70A–70F shown in FIGS. 18–22, the thin plate portion 72a of the inner lead 72 of the lead 71 is tapered. The wire 64 is connected to the tapered thin plate portion 72a at a certain height, which is lower than the upper face of the lead 71. The outer lead 73 of the lead 71 is formed in gull-wing shape. Hereinafter, each of the semiconductor devices 70A–70F will be described in detail.

Figure 18A:
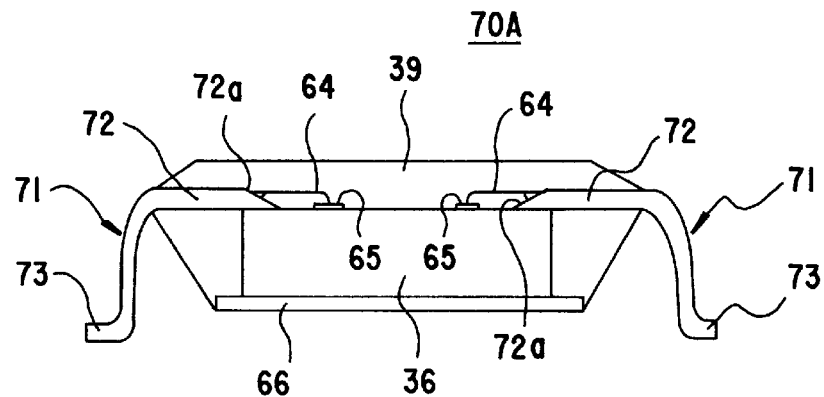
FIGS. 18A and 18B are schematic illustrations showing a fourth embodiment of the present invention.
Figure 18B:
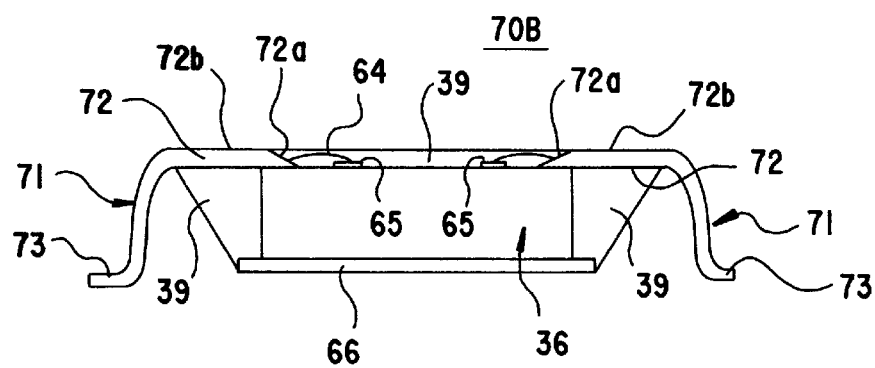
Figure 19:
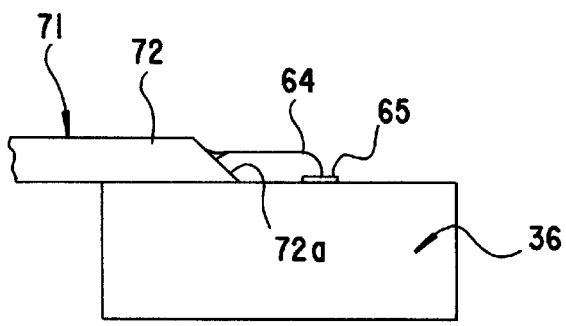
FIG. 19 is an enlarged view showing a thin plate portion shown in FIGS. 18A and 18B.

The semiconductor devices 70A–70D shown in FIGS. 18–20 have the LOC structure in which the lead 71 extends on the upper surface of the semiconductor chip 36. The thin plate portion 72a of the inner lead 72 to which the wire 64 is connected has a tapered shape having a gradually reduced thickness toward the tip end, as shown in FIG. 19. The tapered thin plate portion 72a can be easily prepared by the conventional press-processing or etching method.

The semiconductor devices 70A–70D have the LOC structure in which the wire 64 is provided on the upper face of the semiconductor chip 36. Therefore, the edge-short-circuit can be prevented. Also, since the wire 64 is connected to the position lower than the upper face of the inner lead 72, the connecting position of the wire 64 to the inner lead 72 is made lower. Therefore, the height of the wire loop can be reduced and the thickness of the semiconductor devices 70A–70D can be reduced.

The semiconductor devices 70A, 70B shown in FIGS. 18A and 18B have a multi-frame LOC (MF-LOC) structure in which two lead frames constitute the lead 71 and the stage 66. In the semiconductor device 70A shown in FIG. 18A, the inner lead 72 is completely sealed in the package 39 of sealing resin. In the semiconductor device 70B shown in FIG. 18B, the inner lead 72 has an exposed portion 72b exposed from the package 39 to improve the heat dissipation efficiency of the semiconductor chip 36 and reduce the thickness of the semiconductor device 70B.

Figure 20A:
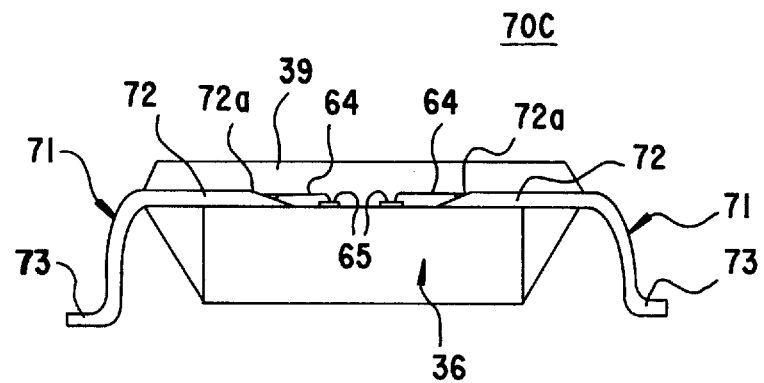
FIGS. 20A and 20B are other schematic illustrations showing the fourth embodiment of the present invention.
Figure 20B:
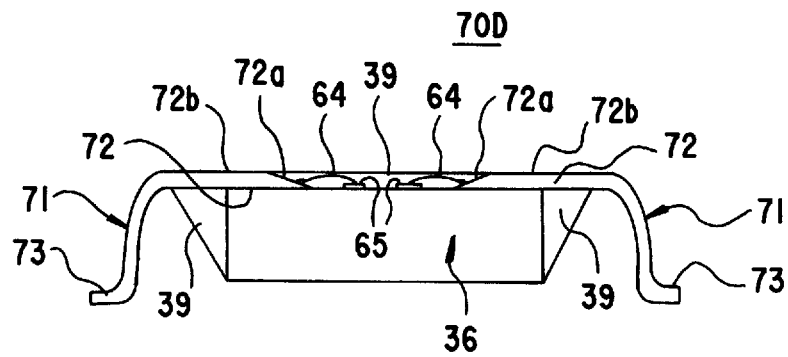

In the semiconductor devices 70C, 70D shown in FIGS. 20A and 20B, the leads 71 are formed by only one lead frame and no stage-side lead frame is used, which is different from the semiconductor devices 70A, 70B of the MF-LOC structure shown in FIGS. 18A and 18B. In the semiconductor device 70C shown in FIG. 20A, the inner leads 72 are completely sealed in the package 39 just as in the semiconductor device 70A shown in FIG. 18A. In the semiconductor device 70D shown in FIG. 20B, the inner leads 72 have the exposed portion 72b exposed from the package 39 to improve the heat dissipation efficiency of the semiconductor chip 36 and reduce the thickness of the semiconductor device 70D, just as in the semiconductor device 70B shown in FIG. 18B.

Figure 21A:
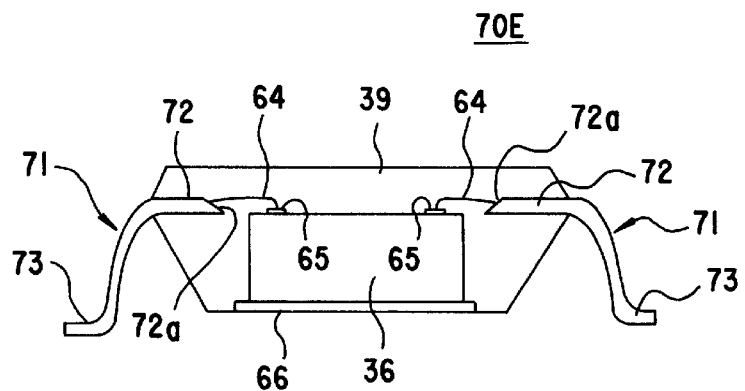
FIGS. 21A and 21B are schematic illustrations showing variations of the fourth embodiment of the present invention.
Figure 21B:
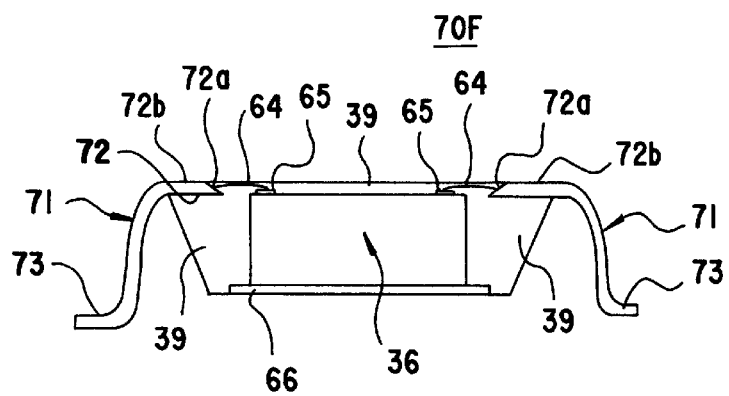
Figure 22:
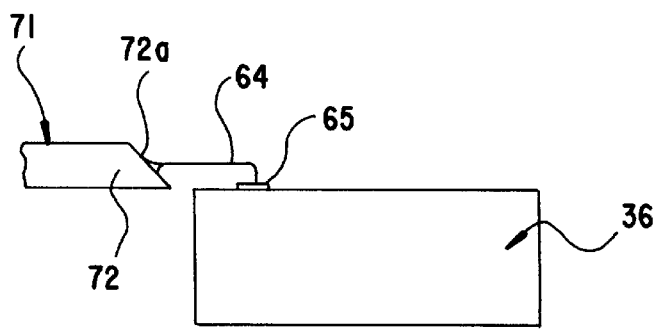
FIG. 22 is an enlarged view showing a thin plate portion shown in FIGS. 21A and 21B.

FIGS. 21A, 21B and 22 show semiconductor devices 70E, 70F, which are variations of the semiconductor devices 70A–70D shown in FIGS. 18–20.

In FIGS. 21A, 21B and 22, the same features as those previously described in the semiconductor devices 70A–70D shown in FIGS. 18–20 are denoted by the same reference numerals and the description thereof will be omitted.

The above-described semiconductor devices 70A–70D have the LOC structure in which the inner leads 72 extend on the upper face of the semiconductor chip 36. Instead, in the semiconductor devices 70E, 70F of the variations, the inner leads 72 extend adjacent to but not contacting the upper surface of the semiconductor chip 36. In these semiconductor devices 70E, 70F, the height of the thin plate portion 72a of the inner lead 72 is almost equal to the height of the top surface of the semiconductor chip 36.

In the semiconductor devices 70A–70D of the non-LOC structure in which the leads 71 are provided at almost the same height as that of the top surface of the semiconductor chip 36, the height of the wire loop can be reduced preventing an edge-short-circuit. Thus, the thickness of the semiconductor devices 70E–70F can be reduced.

In the semiconductor device 70E shown in FIG. 21A, the inner leads 72 are completely sealed in the package 39. In the semiconductor device 70F shown in FIG. 21B, the inner leads 72 have the exposed portion 72b exposed from the package 39 to improve the heat release efficiency of the semiconductor chip 36 and reduce the thickness of the semiconductor device 70F.

Further, the present invention is not limited to these embodiments, but various variations and modifications may be made without departing from the scope of the present invention.

What is claimed is:

1. A semiconductor device comprising:

a semiconductor chip;

a lead having an inner lead and an outer lead continuing to said inner lead, said inner lead having a thin plate portion thinner than the rest of the lead, said thin plate portion being electrically connected to said semiconductor chip through a wire and said outer lead serving as an outer connecting terminal; and a sealing resin sealing said semiconductor chip and at least a part of said lead;

wherein said inner lead of said lead is positioned so as to directly contact a surface of said semiconductor chip.

2. The semiconductor device according to claim 1, wherein said wire has a looped shape whose height is lower than that of said lead except where said thin plate portion is formed.

3. The semiconductor device according to claim 1, wherein said lead except where said thin plate portion is formed is exposed from said sealing resin.

4. The semiconductor device according to claim 2, wherein said lead except where said thin plate portion is formed is exposed from said sealing resin.

5. The semiconductor device according to claim 1, wherein said thin plate portion is reduced in thickness intermittently toward a tip end of said inner lead.

6. The semiconductor device according to claim 2, wherein said thin plate portion is reduced in thickness intermittently toward a tip end of said inner lead.

7. The semiconductor device according to claim 3, wherein said thin plate portion is reduced in thickness intermittently toward a tip end of said inner lead.

8. The semiconductor device according to claim 4, wherein said thin plate portion is reduced in thickness intermittently toward a tip end of said inner lead.

9. The semiconductor device according to claim 1, wherein said thin plate portion has a tapered shape which is reduced in thickness gradually toward a tip end of said inner lead.

10. The semiconductor device according to claim 2, wherein said thin plate portion has a tapered shape which is reduced in thickness gradually toward a tip end of said inner lead.

11. The semiconductor device according to claim 3, wherein said thin plate portion has a tapered shape which is reduced in thickness gradually toward a tip end of said inner lead.

12. The semiconductor device according to claim 4, wherein said thin plate portion has a tapered shape which is reduced in thickness gradually toward a tip end of said inner lead.

* * * * *